(12) United States Patent
Fratti et al.

(10) Patent No.: US 6,313,999 B1
(45) Date of Patent: Nov. 6, 2001

(54) SELF ALIGNMENT DEVICE FOR BALL GRID ARRAY DEVICES

(75) Inventors: Roger Anthony Fratti, Shillington; John Wayne Bowen, Warminster; Dwight David Daugherty, Ephrata, all of PA (US); Xiaohong Jiang, New Providence, NJ (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/329,420

(22) Filed: Jun. 10, 1999

(51) Int. Cl.[7] ............................. H01R 12/32; H01R 12/36
(52) U.S. Cl. ..................... 361/774; 361/783; 361/808; 361/809; 361/820; 439/78; 439/83; 439/526; 439/876; 174/138 G; 174/260; 257/48; 257/773; 257/778; 257/779; 324/765; 29/840; 29/843; 29/854; 29/860; 438/15; 438/108
(58) Field of Search ..................... 361/767–774, 361/807–809, 783, 820; 439/71, 78, 79, 83, 246, 525, 526, 542, 876, 884, 887, 890, 894; 324/765; 257/48, 734, 735, 737, 738, 778, 779, 784, 773; 174/138 G, 250, 253, 260, 261, 267; 438/15, 18, 108; 29/832, 840, 842, 843, 854, 857, 860; 228/180.22

(56) References Cited

U.S. PATENT DOCUMENTS

| | | | | |
|---|---|---|---|---|
| 3,745,513 | * | 7/1973 | Gross | 361/774 |
| 5,076,794 | * | 12/1991 | Ganthier | 439/246 |
| 5,196,726 | | 3/1993 | Nishiguchi et al. | 257/737 |
| 5,214,308 | | 5/1993 | Nishiguchi et al. | 257/692 |
| 5,348,214 | * | 9/1994 | Nishiguchi et al. | 228/180.22 |
| 5,428,191 | * | 6/1995 | Chandler et al. | 174/261 |
| 5,685,725 | * | 11/1997 | Uratsuji | 439/71 |
| 5,699,612 | * | 12/1997 | Inoue et al. | 29/843 |
| 5,810,609 | | 9/1998 | Faraci et al. | 439/71 |
| 5,812,039 | * | 9/1998 | Oldfield | 333/246 |
| 5,898,575 | * | 4/1999 | Hawthorne et al. | 361/809 |
| 5,932,891 | * | 8/1999 | Higashi et al. | 257/48 |
| 5,955,888 | * | 9/1999 | Frederickson et al. | 324/765 |
| 5,962,921 | * | 10/1999 | Farnworth et al. | 257/773 |
| 5,973,394 | * | 10/1999 | Slocum et al. | 257/738 |
| 6,007,349 | * | 12/1999 | DiStefano et al. | 439/71 |
| 6,018,197 | * | 1/2000 | Saiki et al. | 257/784 |
| 6,028,358 | * | 2/2000 | Suzuki | 257/737 |
| 6,033,235 | * | 3/2000 | Ikeya | 439/71 |
| 6,137,063 | * | 10/2000 | JIang | 174/261 |
| 6,174,172 | * | 1/2001 | Kazama | 439/83 |
| 6,205,660 | * | 3/2001 | Fjelstad et al. | 439/71 |

* cited by examiner

*Primary Examiner*—Jeffrey Gaffin
*Assistant Examiner*—John B. Vigushin
(74) *Attorney, Agent, or Firm*—Duane, Morris & Heckscher LLP

(57) ABSTRACT

An apparatus which aligns a ball grid array (BGA) device over a substrate. The apparatus preferably includes a cup-shaped member for cupping and holding the solder balls of the BGA device, and an elongate member attached to the cup-shaped member. The cup-shaped member is attached between the BGA device and the substrate at two or more different positions so that the solder balls of the BGA device become aligned over the terminals of the substrate by operation of gravity.

20 Claims, 6 Drawing Sheets

SELF ALIGNMENT DEVICE FOR BALL GRID ARRAY DEVICES

FIELD OF THE INVENTION

The present invention relates to electrical devices, and in particular to electrical devices for aligning the solder balls of a ball grid array semiconductor device.

DESCRIPTION OF THE RELATED ART

Semiconductor devices have been traditionally connected to other circuitry through the use of conductive metal pins. These metal pins provide input/output (I/O) terminals for transferring signals to and from the semiconductor device. The pins are typically arranged in rows or arrays on a surface of the semiconductor device, a configuration generally referred to as Pin Grid Array (PGA). Typically, the I/O pins of a PGA device are attached to other circuits and substrates through the use of wire bonds or solder. However, the drawbacks associated with PGA configurations have forced semiconductor manufacturers to develop new methods of attachment over the past decade. One such technology is referred to as Ball Grid Array (BGA) configuration.

In a BGA configuration, solder balls are formed on the I/O terminals of the semiconductor device. The solder balls are formed by depositing drops of solder on flat terminal pads formed on the surface of the semiconductor device. The semiconductor device is then attached to other devices by a process known as "flip-chip" mounting. Essentially, the semiconductor device is flipped upside down so that the solder balls face the surface of a substrate to which the semiconductor device is to be attached. The substrate typically includes flat pad terminals, much like the flat pad terminals on the semiconductor device, which correspond in position to the solder balls on the device. The semiconductor device is placed over the flat pad terminals of the substrate, so that the balls contact the flat pads on the substrate. The entire structure is then heated, causing the solder balls to reflow and form a stable connection between the semiconductor device and the substrate.

Many BGA semiconductor devices are subjected to testing at some point during the fabrication process. For testing applications, the semiconductor devices are removably mounted on a test fixture or substrate which provides electrical connections to the terminals of the semiconductor device. The test substrate is often similar to the bonding substrate described above, except that the solder balls are not allowed to reflow and become permanently connected to the substrate terminals. In order to test the semiconductor device, it is placed over the test substrate so that the solder balls contact the terminals formed on the test substrate. Typically, the device is held in place by a thumb screw or other similar means. Once the device is positioned on the substrate, control signals are supplied thereto through the test substrate terminals and measurements are made. These measurements are then used to determine whether the semiconductor device meets required design specifications.

FIG. 1 shows a conventional arrangement where a ball grid array (BGA) semiconductor device 10 is placed over a substrate 20. The semiconductor device 10 includes a plurality of solder balls 15. The substrate 20 includes a plurality of terminals 25 which correspond in position to the solder balls 15. The substrate 20 also includes metal traces 30 formed on the surface of the substrate. The metal traces 30 provide a means of connecting the semiconductor device 10 to other circuit elements (not shown). In order to attach the semiconductor device 10 to the substrate 20, the solder balls 15 of the device must be aligned with the terminals 25 of the substrate 20. As mentioned above, this method of attachment is known as "flip chip" bonding since the semiconductor device 10 is flipped upside down (i.e. solder balls face down) and placed over the substrate 20. In order to form a reliable bond between the semiconductor device 10 and the substrate 20, the balls 15 of the device are placed on the terminals 25 of the substrate 20. The entire device is then heated and then cooled, causing the solder balls 15 to melt and reform. The reflowing of the solder balls 15 forms a reliable electrical connection between the semiconductor device 10 and the substrate 20. However, if the solder balls 15 are not perfectly aligned over the terminals 25 of the substrate, various problems can occur (e.g. short circuits between terminals).

FIG. 1 shows the solder balls 15 as being slightly off-center from the terminals 25 (by a distance d), as is often the case. Misalignment can occur from numerous causes, the most significant being improper placement of the semiconductor device over the substrate. The misalignment of the solder balls 15 can cause numerous problems which can result in the malfunction of the semiconductor device. If one of the solder balls flows into the space between terminals 25, a short circuit may occur between two terminals 25. Further, if a solder ball 15 is not properly aligned with the correct terminal 25, a weakened electrical connection, or no connection may be caused to form.

Proper alignment is necessary not only when bonding semiconductor devices to substrates, but also during the testing of semiconductor devices. Semiconductor devices with BGA terminals are typically tested by placing them on a test substrate and supplying control signals thereto. The semiconductor devices are usually held to the substrate by a thumb screw or other similar means. The testing arrangement is very similar to the bonding arrangement described above, except that the device and substrate are not heated so that the solder balls melt. In this way, one substrate can be used to test multiple semiconductor devices. When testing, improper alignment of the semiconductor device can result in erroneous measurements.

As stated above, a major problem associated with BGA devices is obtaining the proper alignment of the solder balls of the semiconductor device over the flat pad terminals of the substrate. Often the semiconductor device is improperly placed over the substrate, or the device shifts during the heating process, causing the balls to become improperly aligned. In bonding applications, improper alignment can cause erroneous connections to be formed, and thus results in malfunction of the semiconductor device. In testing applications, misalignment can result in erroneous measurements. Various technologies have been developed to combat this problem. Most solutions are concerned with changing the topography of the substrate to better accommodate the balls of the semiconductor device. For example, U.S. Pat. Nos. 5,196,726 and 5,214,308, both to Nishiguchi et al., disclose substrates with depressions formed therein for receiving the balls of a BGA device. U.S. Pat. No. 5,810,609 to Faraci et al. shows a substrate with multiple spiral-like connectors formed thereon for receiving the balls of a BGA device. However, substrates like the ones described in the aforementioned patents are expensive and difficult to produce. Therefore, there currently exists a need for an alignment device for BGA devices which is both inexpensive and easy to manufacture.

SUMMARY OF THE INVENTION

The present invention is a alignment device for aligning the balls of a BGA device over a substrate. The alignment device includes a cup-shaped member which receives and aligns the balls of a BGA device. The alignment device is inserted between a BGA device and the substrate before bonding or testing. The alignment device of the present invention provides an efficient alignment tool for BGA devices which is both inexpensive and easy to produce.

The above and other advantages and features of the present invention will be better understood from the following detailed description of the preferred embodiments of the invention which is provided in connection with the accompanying drawings.

DETAILED DESCRIPTION

Ball grid array (BGA) semiconductor devices are typically connected to other devices for by a process known as "flip chip" mounting. Using this mounting process, BGA devices can be bonded to other substrates ("bonding applications") or electrically connected to other substrates to facilitate testing of the semiconductor device ("testing applications"). In the "flip chip" process, the solder balls of the semiconductor device are aligned over the flat pad terminals of the substrate or device to which the semiconductor device is connected. If the solder balls of the semiconductor device are not properly aligned over the flat pad terminals, various problems can occur. In testing applications, misalignment can cause testing equipment to register erroneous measurements. In bonding applications, improper alignment can result in malfunction of the semiconductor device due to short circuited connections.

The present invention is an alignment device which assists in the proper alignment of semiconductor devices and substrates during both testing and bonding applications. The alignment device of the present invention is simple to manufacture, and may be added to existing substrates with relative ease. Therefore, the present invention provides an uncomplicated and inexpensive method of aligning BGA semiconductor devices and substrates.

Figure 1:
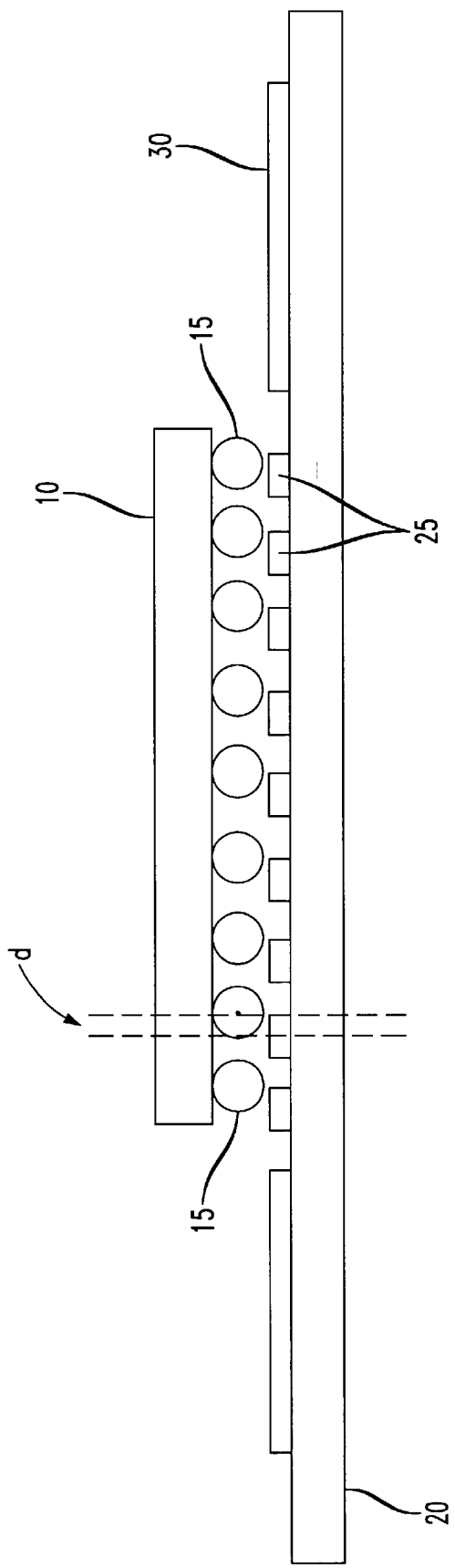
FIG. 1 is a cross sectional view of a conventional BGA device and substrate.
Figure 2A:
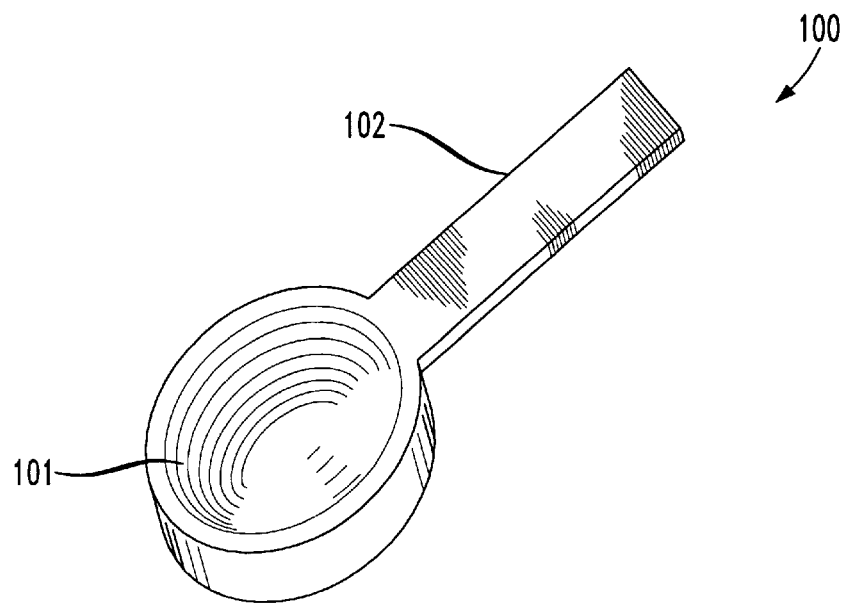
FIG. 2(a) is an isometric view of an alignment device according to a first embodiment of the present invention.

FIG. 2(a) shows the alignment device 100 according to a first embodiment of the present invention. The alignment device 100 is designed particularly for use in testing applications. The alignment device 100 includes two portions, a cup-shaped portion 101 and an elongate portion 102, and overall resembles a spoon. The cup-shaped portion 101 aligns and supports a single ball of a BGA semiconductor device. The elongate portion 102, connects the cup-shaped portion to other circuitry (e.g. metal traces) disposed on the surface of the substrate. The elongate portion 102 can be connected to other circuitry by gap-welding, soldering or other techniques known in the art. The alignment device 100 may be disposed between a semiconductor device and a substrate, so that when the semiconductor device is placed over the substrate for testing, the cup-shaped portion 101 of the alignment device 100 holds the solder balls of the semiconductor device to ensure alignment of the semiconductor device over the substrate. When a solder ball is seated in any portion of the cup-shaped portion 101, it tends to move towards the lowest point, which is in the center. Thus, by positioning the center of the cup-shaped portion at the desired position of the solder ball, the BGA device is self-centered under the operation of gravity.

Figure 2B:
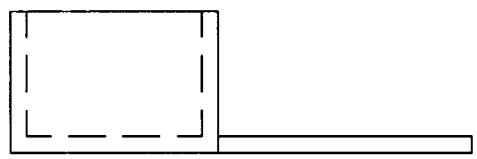
FIG. 2(b) is a cross sectional view of an alignment device according to a second embodiment of the present invention.
Figure 2C:
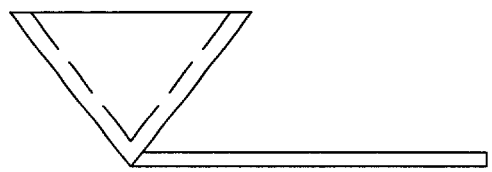
FIG. 2(c) is a cross sectional view of an alignment device according to a third embodiment of the present invention.
Figure 2D:
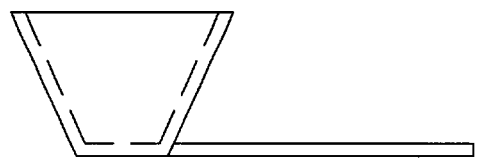
FIG. 2(d) is a illustrates a cross sectional view of an alignment device according to a fourth embodiment of the present invention.
Figure 2E:
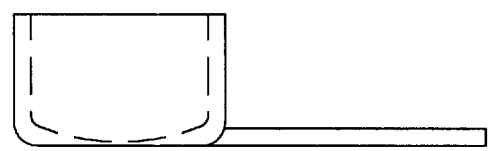
FIG. 2(e) is a cross sectional view of an alignment device according to a fifth embodiment of the present invention.

The alignment device 100 can be made of various materials, but gold, beryllium copper and alloys thereof are preferred because both gold and beryllium copper are a strong electrical conductors and have high melting points. Further, although shown in a semi-spherical shape in FIG. 2(a), the cup-shaped portion 101 of the alignment device 100 may be formed into in various other shapes without departing from the scope of the invention. For example, the cup-shaped portion 101 may be formed shapes such as squares (FIG. 2(b)), cones (FIG. 2(c)), polygons (FIG. 2(d)), and semi-cylinders (FIG. 2(e)). The preceding shapes are only examples, other shapes and cross sections may be used. For example, the cup-shaped portion 101 may be a portion of a sphere, ellipsoid, paraboloid, or hyperboloid. Preferably, the cup-shaped portion 101 is rotationally symmetric, with the axis of symmetry being vertical.

Figure 2F:
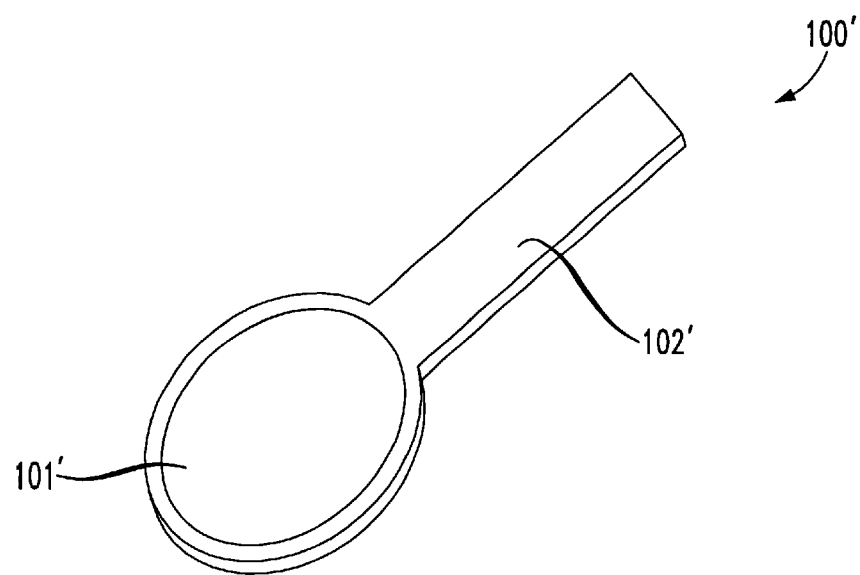
FIG. 2(f) is an isometric view of an alignment device according to a sixth embodiment of the present invention.
Figure 2G:
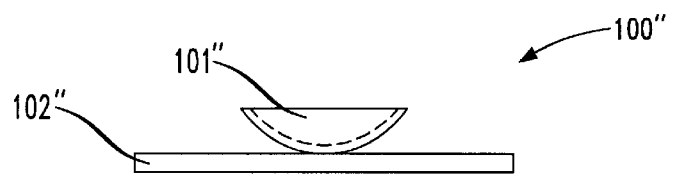
FIG. 2(g) is a cross sectional view of an alignment device according to a seventh embodiment of the present invention.
Figure 2H:
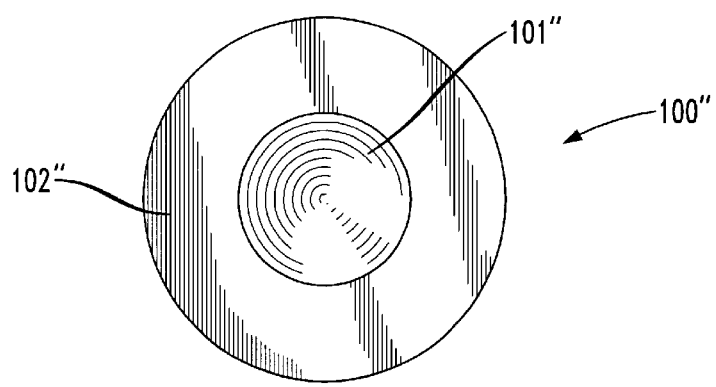
FIG. 2(h) is a top plan view of an alignment device according to a seventh embodiment of the present invention.
Figure 2I:
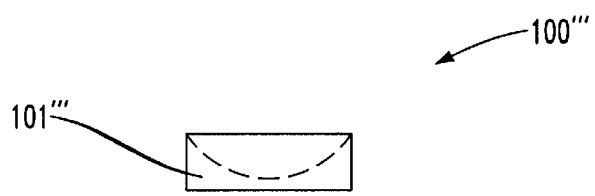
FIG. 2(i) is a cross sectional view of an alignment device according to an eighth embodiment of the present invention.
Figure 2J:
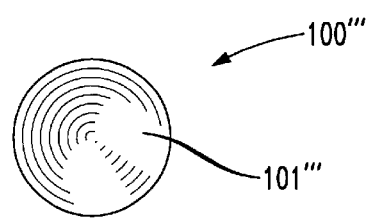
FIG. 2(j) is a top plan view of an alignment device according to an eighth embodiment of the present invention.

In addition to the shapes described above, the alignment device 100 may be formed as shown in FIGS. 2(g)–(j). The alignment device 100" shown in FIGS. 2(g) and 2(h) includes a circular flat member 102" in place of the elongate member 102 shown in FIG. 2(a), the cup-shaped portion 101", however, is formed in essentially the same shape as the cup-shaped portion 101. The cup-shaped portion 101" is preferably located at a central portion of the circular flat member 102", and may be formed in any of the shapes described above with reference to FIGS. 2(a)–(e). By "central portion" it is meant that the cup-shaped portion 101" should be located centrally with respect to at least one axis of the circular flat member 102", it need not be located in the exact center of the circular member 102" (i.e. it may be located closer to the edges of the circular flat member). Although the alignment device is described as having a substantially circular flat member 102", it should be understood by those skilled in the art that the flat member may be formed in a variety of shapes without departing from the scope of the invention (e.g. rectangles, polygons). Alignment device 100" is particularly usefull in situations where a connection between metal traces on the substrate and the semiconductor device is not required (e.g. where the metal traces on the substrate extend completely to the underside of the semiconductor device, see FIGS. 3–4). The alignment device 100′′′ shown in FIGS. 2(i) and 2(j) is a variation on the alignment device 100′′, where the circular flat member 102′′ is completely eliminated. To compensate, the side and bottom walls of the cup-shaped portion 101′′′ are made flat. Alignment device 100′′′ is also useful in situations where a connection between metal traces on the substrate and the semiconductor device is not required.

In bonding applications, the cup-shaped portion 101 may be formed as a ring-shaped member 101′ as shown in FIG. 2(f). The ring shaped member 101′ allows the solder balls to melt through and form a bond between the semiconductor device and the substrate. The ring-shaped alignment device 100′ may also be used in a testing application, however, it should be noted that the diameter of the ring portion 101′ must be less then the diameter of the solder ball so that the ball does not pass completely through the ring before bonding. Because the material of the alignment device 100′ has a much higher melting point than the solder, it does not melt at the temperature at which the solder balls reflow, and thus does not interfere with the bonding process.

Figure 3:
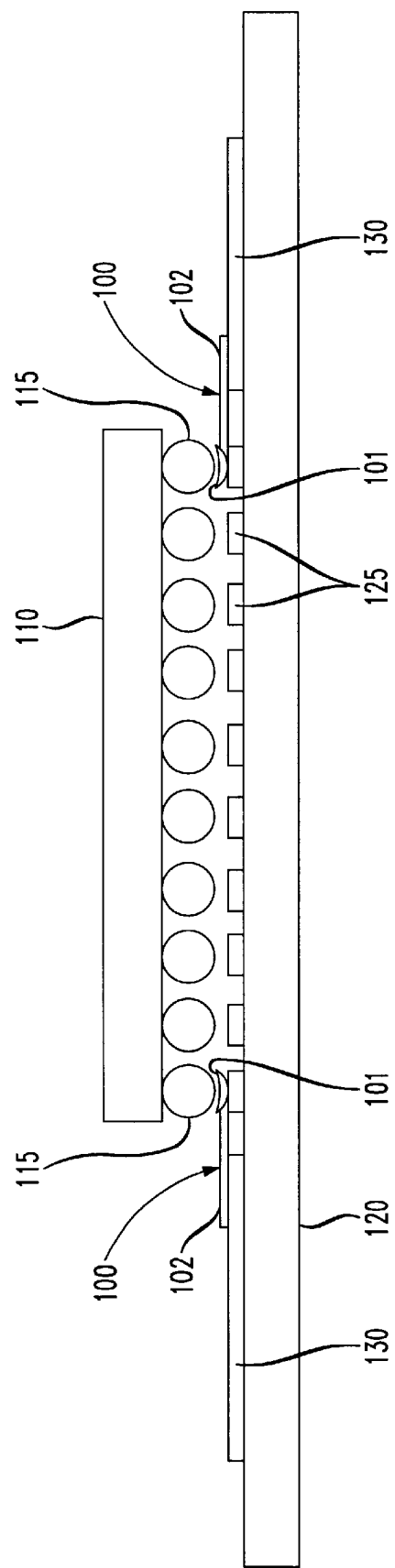
FIG. 3 is a cross sectional view of a BGA device and substrate utilizing the alignment device of the present invention.
Figure 4:
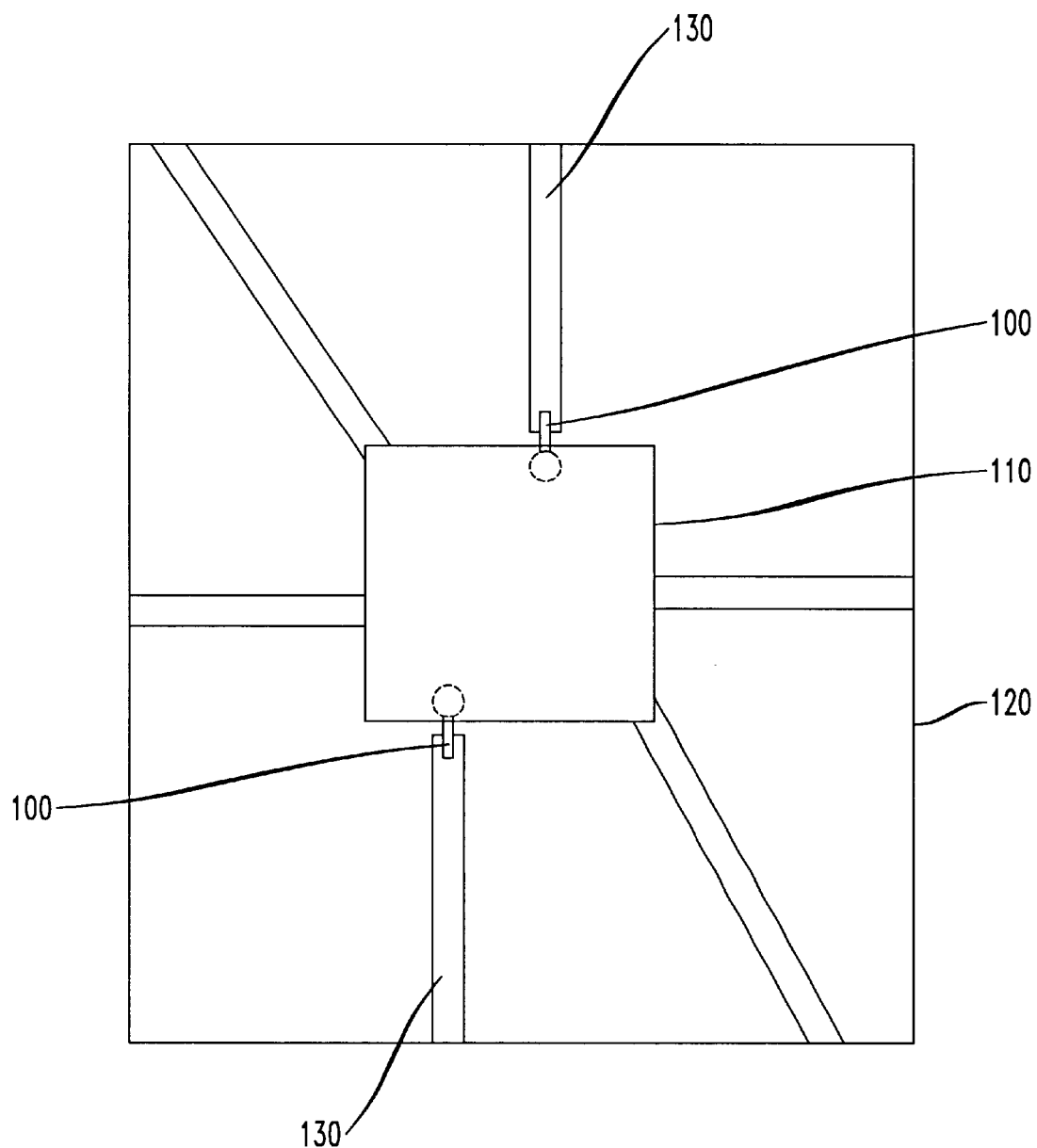
FIG. 4 is a plan view of a BGA device and substrate utilizing the alignment device of the present invention.

FIGS. 3 and 4 show the alignment device 100 of the present invention used in an exemplary "flip chip" testing arrangement. FIG. 3 is a side view of the arrangement, and FIG. 4 is a top plan view. The arrangement includes a BGA semiconductor device 110 with associated solder balls 115, and a substrate 120 with associated terminals 125 and traces 130. The BGA semiconductor device 110 is attached to the substrate 120 utilizing at least two alignment devices 100. The alignment devices 100 are placed inbetween the semiconductor device 110 and the substrate 120 so that the cup-shaped portion 101 of each alignment device cradles a respective solder ball 115 of the semiconductor device 110. Although only two alignment devices 100 are shown in the exemplary embodiment, it should be understood that any number of alignment devices may be used without departing from the scope of the present invention. Using more alignment devices provides a more accurate alignment between the semiconductor device and the substrate. It will be understood by those skilled in the art that the same arrangement shown in FIGS. 3 and 4 for testing applications can also be used for bonding applications if the alignment devices 100 are replaced with alignment devices 100′ which allow solder to flow through.

The alignment device according to the invention can serve both to align the BGA device and to form an electrical connection to the metal traces 130 of the substrate 120. Alternatively, the alignment device may be used solely for its alignment function, without requiring a connection to a circuit or device on the substrate 120.

The alignment devices of the present invention are inexpensive and easy to produce, and hence provide significant advantages over conventional alignment devices. Additionally, the alignment devices of the present invention can be added to existing substrates, thus eliminating the need for specialized substrates. Further, the alignment devices of the present invention can be manufactured in various sizes to accommodate the various diameters of solder balls.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. An apparatus comprising:
    a substrate with at least one electrical trace formed thereon; and
    an alignment device including an elongate member and a cup member attached to the elongate member and extending therefrom, said elongate member of said alignment device extending parallel to said substrate and connecting said alignment device to said at least one electrical trace.

2. The apparatus of claim 1, wherein the cup member has a shape selected from the group consisting of: polygon, square, conical, semi-spherical and semi-cylindrical shapes.

3. The apparatus of claim 1, wherein the elongate member and the cup member are made of a substance selected from the group consisting of: gold, gold alloys and beryllium copper alloys.

4. The apparatus of claim 1, wherein the cup member is shaped to align a solder ball of a ball grid array device placed thereon.

5. The apparatus of claim 1, wherein the alignment device is an electrical connector.

6. A circuit apparatus comprising:
    a substrate having a plurality of contact terminals and a plurality of electrical traces formed thereon;
    at least two alignment devices for aligning respective solder balls over the substrate, said at least two alignment devices coupled to respective ones of the contact terminals and each comprising an elongate member and a cup member attached to the elongate member and extending therefrom, said elongate members of said at least two alignment devices extending parallel to said substrate and connecting said alignment devices to said plurality of electrical traces.

7. The apparatus of claim 6, wherein the cup member has a shape selected from the group consisting of: polygon, square, conical, semi-spherical and semi-cylindrical shapes.

8. The apparatus of claim 6, wherein the elongate member and the cup member are made of a substance selected from the group consisting of: gold, gold alloys and beryllium copper alloys.

9. The apparatus of claim 8, wherein the cup members of the alignment devices align an additional substrate having a ball grid array over the substrate.

10. The apparatus of claim 6, further comprising:
    a plurality of electrically conductive lines on the substrate connected to some of the plurality of contact terminals.

11. The apparatus of claim 10, wherein the apparatus is a test socket for ball grid array devices.

12. The apparatus of claim 10, wherein at least two of the plurality of electrically conductive lines are coupled to the elongate members of the at least two alignment devices.

13. The apparatus of claim 6, wherein a ball grid array device is positioned over the substrate so that at least two solder balls of the ball grid array device contact the at least two alignment devices.

14. The apparatus of claim 6, wherein the at least two alignment devices comprise at least two electrical connectors.

15. A method of supporting a ball grid array device over a substrate comprising the steps of:

interposing at least two alignment devices between the ball grid array device and the substrate, said substrate including at least two electrical traces formed thereon such that elongate portions of the at least two alignment devices extend parallel to said substrate and connect to the at least two electrical traces respectively;

moving a ball grid array device towards the substrate so that at least two solder balls of the ball grid array device contact the at least two alignment devices.

16. The method of claim 15, further comprising the step of:

aligning the substrate and the ball grid array device by operation of gravity when the ball grid array device engages the alignment devices.

17. The method of claim 15, wherein each of the at least two alignment devices comprise:

an elongate member for connecting to an electrical line; and, a cup member attached to the elongate member and extending therefrom.

18. The method of claim 17, further comprising the step of:

coupling the elongate members of each of the at least two alignment devices to at least one electrical line.

19. An apparatus comprising:

a substrate with at least one electrical trace formed thereon; and, an alignment device including a substantially flat member connected to the at least one electrical trace, and a cup member attached to the flat member and extending from a central portion thereof, said cup member for receiving a solder ball of a ball grid array device.

20. The apparatus of claim 19, wherein the flat member is substantially circular.

* * * * *